US011501816B2

(12) United States Patent
Vimercati

(10) Patent No.: US 11,501,816 B2
(45) Date of Patent: *Nov. 15, 2022

(54) LOW VOLTAGE FERROELECTRIC MEMORY CELL SENSING

(71) Applicant: Micron Technology, Inc., Boise, ID (US)

(72) Inventor: Daniele Vimercati, El Dorado Hills, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/236,734

(22) Filed: Apr. 21, 2021

(65) Prior Publication Data

US 2021/0312968 A1 Oct. 7, 2021

Related U.S. Application Data

(63) Continuation of application No. 16/746,626, filed on Jan. 17, 2020, now Pat. No. 10,998,029.

(51) Int. Cl.
*G11C 11/22* (2006.01)

(52) U.S. Cl.
CPC ........ *G11C 11/2273* (2013.01); *G11C 11/221* (2013.01); *G11C 11/2255* (2013.01); *G11C 11/2257* (2013.01); *G11C 11/2259* (2013.01)

(58) Field of Classification Search
CPC .............. G11C 11/2273; G11C 11/221; G11C 11/2255; G11C 11/2257; G11C 11/2259; G11C 27/026; G11C 11/2293

USPC ........................................................ 365/145
See application file for complete search history.

(56) References Cited

U.S. PATENT DOCUMENTS

| 9,552,864 B1* | 1/2017 | Vimercati ........... G11C 11/2275 |
| 2010/0128545 A1 | 5/2010 | Lee et al. |
| 2012/0281470 A1 | 11/2012 | Fukuda |
| 2017/0117025 A1 | 4/2017 | Lee |
| 2017/0316833 A1 | 11/2017 | Ihm et al. |

(Continued)

OTHER PUBLICATIONS

ISA/KR, International Search Report and Written Opinion of the International Searching Authority, Int'l Appl. No. PCT/US2021/012300, dated Apr. 22, 2021, Korean Intellectual Property Office, Seo-gu, Daejeon, Republic of Korea, 9pgs.

*Primary Examiner* — Fernando Hidalgo
(74) *Attorney, Agent, or Firm* — Holland & Hart LLP

(57) ABSTRACT

Methods, systems, and devices for low voltage ferroelectric memory cell sensing are described. As part of an access operation for a memory cell, gates of two cascodes may be biased to compensate for associated threshold voltages. An extracted signal corresponding to a charge stored in the memory cell may be transferred through a first cascode to charge a first capacitor. Similarly, a reference signal developed at a dummy digit line may be transferred through a second cascode to charge a second capacitor. By comparing the reference signal developed at the dummy digit line to the extracted signal from the memory cell, the effect of variations in memory cell performance on the sense window may be reduced. Additionally, based on biasing the gates of the cascodes, the difference between the signals compared at the sense component may be low compared to other sensing schemes.

20 Claims, 8 Drawing Sheets

(56) References Cited

U.S. PATENT DOCUMENTS

2017/0352397 A1* 12/2017 Guo .................. G11C 11/2273
2019/0333563 A1    10/2019 Di Vincenzo

* cited by examiner

|  | t0 | t1 | t2 | t3 | t4 | t5 | t6 |
|---|---|---|---|---|---|---|---|
| Word Line 410 | OFF | OFF | OFF | OFF | ON | ON | ON |
| Switches 431 | ON | ON | OFF | OFF | ON | OFF | OFF |
| Switches 432 | ON | ON | ON | ON | OFF | OFF | OFF |
| Switches 433 | OFF | OFF | ON | ON | OFF | ON | ON |
| Switches 434 | OFF | ON | ON | OFF | OFF | OFF | OFF |
| Switches 435 | VSAREF | VSAREF | VSAREF | VSAREF | 0V | 0V | 0V |
| Switches 436 | ON | ON | ON | ON | ON | ON | OFF |

401

LOW VOLTAGE FERROELECTRIC MEMORY CELL SENSING

CROSS REFERENCE

The present Application for Patent is a continuation of U.S. patent application Ser. No. 16/746,626 by Vimercati, entitled "LOW VOLTAGE FERROELECTRIC MEMORY CELL SENSING," filed Jan. 17, 2020, assigned to the assignee hereof, and is expressly incorporated by reference in its entirety herein.

BACKGROUND

The following relates generally to one or more memory systems and more specifically to low voltage ferroelectric memory cell sensing.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

Figure 1:
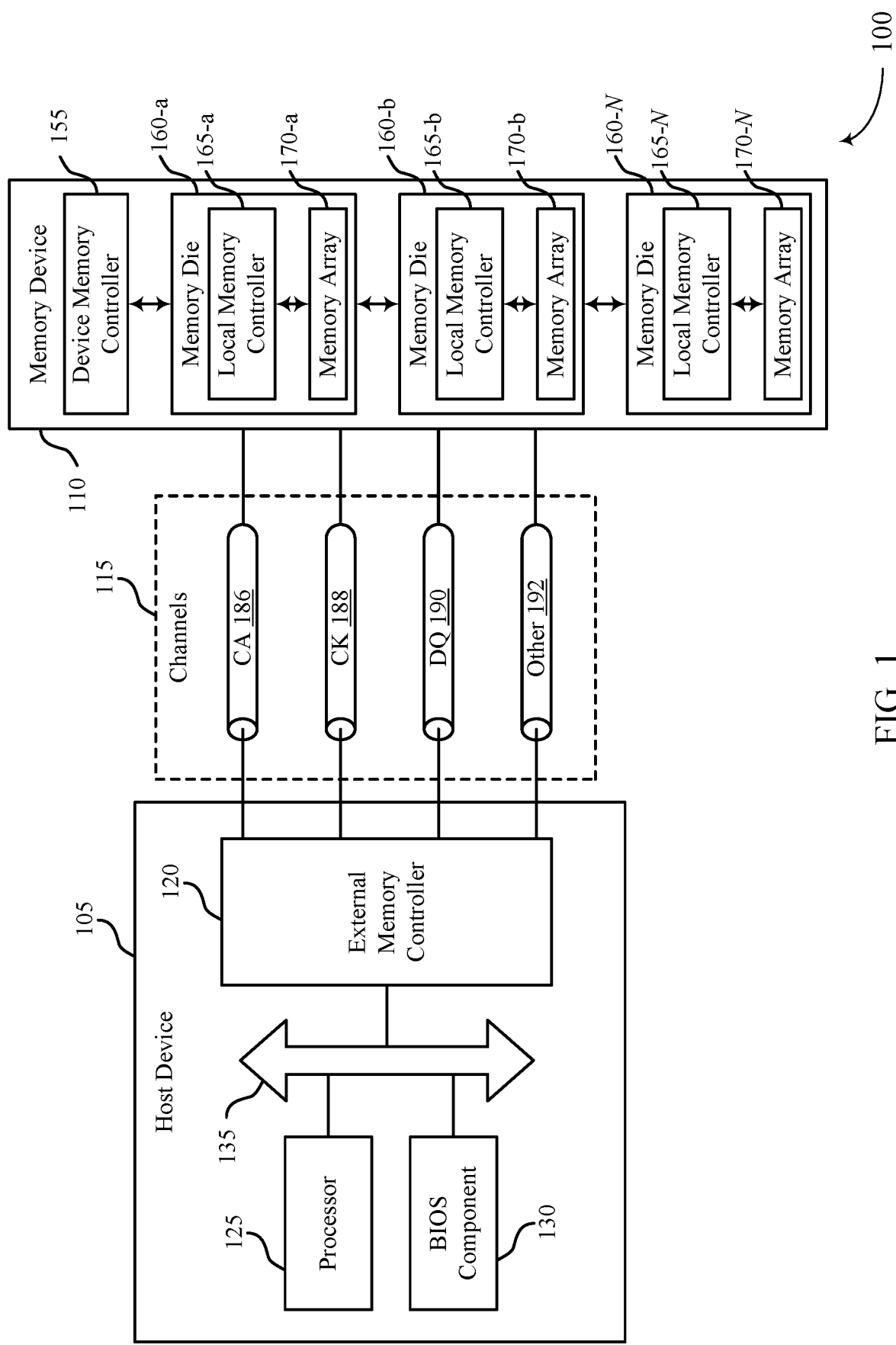
FIG. 1 illustrates an example of a system that supports low voltage ferroelectric memory cell sensing in accordance with examples as disclosed herein.

Memory devices may use various components to bias access lines of a memory die to access memory cells of that memory die. For example, one or more cascodes may be biased to different voltage levels as part of different operations performed on the memory die. The cascodes may share charge or voltage with the access lines (e.g., digit lines, word lines, plate lines, etc.) of the memory die to activate the access lines and access information stored in memory cells coupled with the access lines.

As part of an access operation, a signal (e.g., a voltage) corresponding to a charge stored in a memory cell may be extracted through a first cascode. The extracted signal may charge a capacitor (e.g., an amplification capacitor (AMP-CAP)). A sense component (e.g., a latch) may compare the extracted signal and the reference signal to determine a logic state (e.g., a logic 1 or a logic 0) stored in the memory cell.

In some examples, performance of the memory cell may vary over time based on one or more factors (e.g., temperature, humidity, materials, etc.), which may affect the extracted signal. However, the reference voltage may not vary with performance of the memory cell, and so the reference signal may remain fixed. The variations in the performance of the memory cell, in combination with the fixed reference voltage, may reduce a sense window for determining the logic state stored in the memory cell. The reduced sense window may thus introduce errors when performing access operations (e.g., read operations, write operations, etc.).

According to the techniques described herein, a reference signal at a sense component may be based on a charge stored in a capacitor. A memory device may include a precharge voltage source for precharging a digit line coupled with the memory cell and the dummy digit line coupled with a source of a reference signal to a precharge voltage. As part of an access operation, gates of two cascodes may be biased to compensate for associated threshold voltages. The cascodes may be isolated from the access lines during the biasing operations. Following the biasing operations, the extracted signal corresponding to a charge stored in a memory cell may be transferred through a first cascode to charge a first AMPCAP. Similarly, a reference signal based on the dummy digit line may be transferred through a second cascode to charge a second AMPCAP. That is, the extracted signal and the reference signal may be developed based on charge sharing through respective cascodes. By comparing the reference signal developed at the dummy digit line to the extracted signal from the memory cell, the effect of variations in memory cell performance on the sense window may be reduced. Additionally, based on biasing the gates of the cascodes, the difference between the signals compared at the sense component may be low compared to other sensing schemes. The biasing may thus reduce power consumption associated with the access operation and/or improve the sense window of the memory device as the memory device is used.

Features of the disclosure are initially described in the context of memory systems and dies as described with reference to FIGS. 1-2. Features of the disclosure are described in the context of a circuit and a timing diagram described with reference to FIGS. 3-4. These and other features of the disclosure are further illustrated by and described with reference to an apparatus diagram and flowcharts that relate to low voltage ferroelectric memory cell sensing as described with references to FIGS. 5-8.

FIG. 1 illustrates an example of a system 100 that supports low voltage ferroelectric memory cell sensing in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory dies 160 may include any quantity of stacked memory arrays 170 (e.g., two high, three high, four high, five high, six high, seven high, eight high). In some 3D memory dies 160, different decks may share at least one common access line such that some decks may share one or more of a word line, a digit line, or a plate line.

In some examples, the one or more memory dies 160 may each include sense components for extracting and determining data stored in memory cells of the memory arrays 170, for example as part of an access operation based on a command from a memory controller (e.g., a local memory controller 165, the device memory controller 155, the external memory controller 120, etc.). The sense component may be coupled to access lines via cascodes. As part of an access operation, gates of the cascodes may be biased to compensate for threshold voltages of the cascodes. One or more access lines may then be activated, which may enable access to one or more memory cells. Activating the one or more access lines may include precharging a digit line and a dummy digit line. A signal corresponding to a charge stored in a memory cell may be extracted through a first cascode, and a reference signal based on the dummy digit line may be transferred through a second cascode. The extracted signal and the reference signal may each charge a respective capacitor (e.g., an AMPCAP), and the sense component may compare the extracted signal and the reference signal to determine a logic state (e.g., a logic 1 or a logic 0) stored in the memory cell. By comparing the reference signal developed at the dummy digit line to the extracted signal from the memory cell, the effect of variations in memory cell performance on a sense window at the sense component may be reduced. Additionally, based on biasing the gates of the cascodes, the difference between the signals compared at the sense component may be low compared to other sensing schemes. The biasing may thus reduce power consumption associated with the access operation.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

Figure 2:
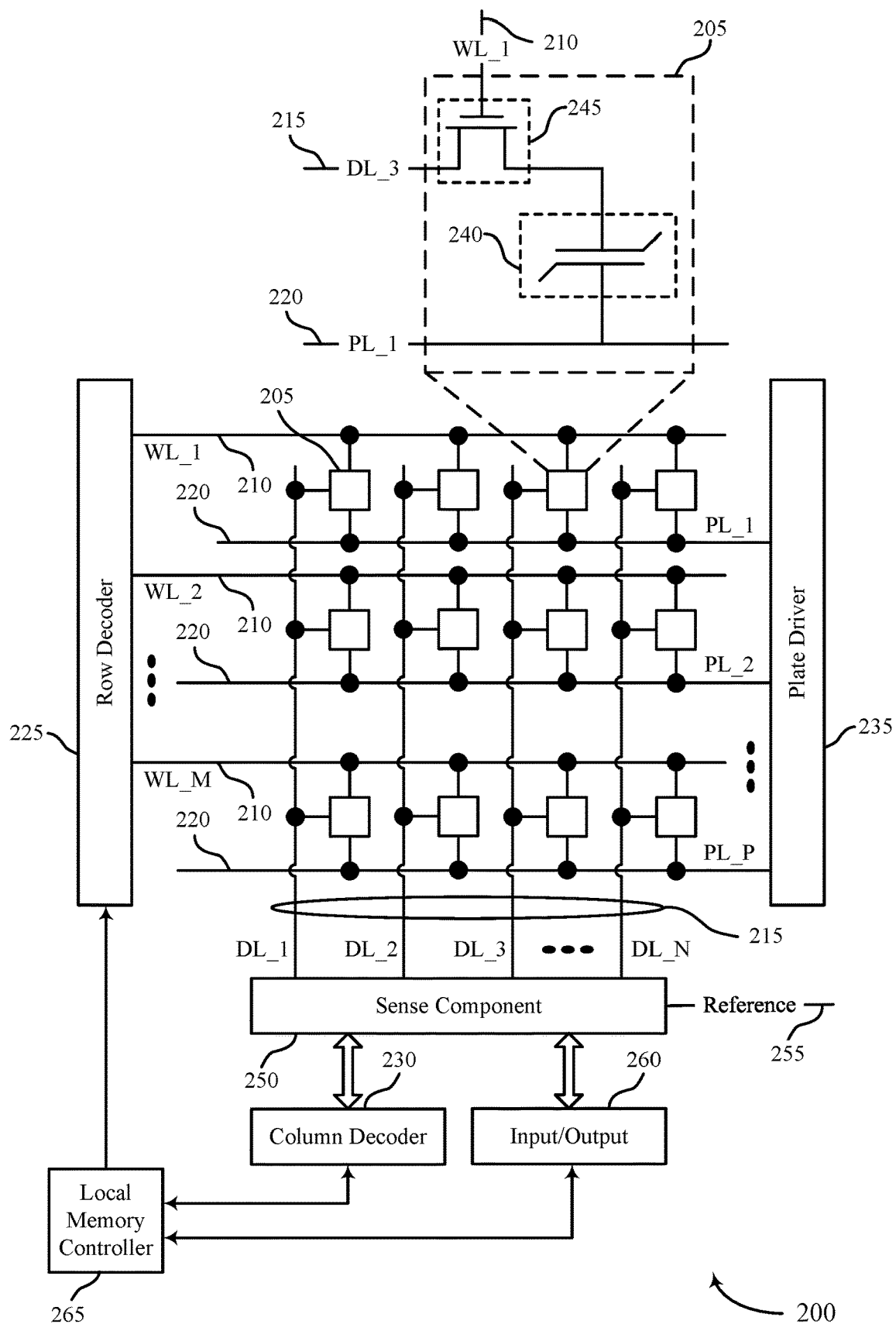
FIG. 2 illustrates an example of a memory die that supports low voltage ferroelectric memory cell sensing in accordance with examples as disclosed herein.

FIG. 2 illustrates an example of a memory die 200 that supports low voltage ferroelectric memory cell sensing in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a state (e.g., polarization state or dielectric charge) representative of the programmable states in a capacitor. In FeRAM architectures, the memory cell 205 may include a capacitor 240 that includes a ferroelectric material to store a charge and/or a polarization representative of the programmable state. The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

The memory die 200 may include access lines (e.g., the word lines 210, the digit lines 215, and the plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation. Memory cells 205 may be positioned at intersections of the word lines 210, the digit lines 215, and/or the plate lines 220.

Operations such as reading and writing may be performed on memory cells 205 by activating or selecting access lines such as a word line 210, a digit line 215, and/or a plate line 220. By biasing a word line 210, a digit line 215, and a plate line 220 (e.g., applying a voltage to the word line 210, digit line 215, or plate line 220), a single memory cell 205 may be accessed at their intersection. Activating or selecting a word line 210, a digit line 215, or a plate line 220 may include applying a voltage to the respective line.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be operable to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be operable to selectively couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may cooperate with the digit line 215 to bias the capacitor 240 during access operation of the memory cell 205.

The sense component 250 may determine a state (e.g., a polarization state or a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage). The detected logic state of the memory cell 205 may be provided as an output of the sense component 250 (e.g., to an input/output 260), and may indicate the detected logic state to another component of a memory device 110 that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target digit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a read operation (e.g., a sense operation) on one or more memory cells 205 of the memory die 200. During a read operation, the logic state stored in a memory cell 205 of the memory die 200 may be determined. The local memory controller 265 may identify a target memory cell 205 on which to perform the read operation. The local memory controller 265 may identify a target word line 210, a target digit line 215, and target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The target memory cell 205 may transfer a signal to the sense component 250 in response to biasing the access lines. The sense component 250 may amplify the signal. The local memory controller 265 may activate the sense component 250 (e.g., latch the sense component) and thereby compare the signal received from the memory cell 205 to the reference 255. Based on that comparison, the sense component 250 may determine a logic state that is stored on the memory cell 205.

In some examples, the sense component 250 may be coupled to access lines (e.g., word lines 210, digit lines 215, plate lines 220, etc.) via cascodes. As part of an access operation, gates of the cascodes may be biased to compensate for threshold voltages of the cascodes. One or more access lines may then be activated, for example by precharging a digit line 215 and a dummy digit line (not shown) associated with the reference signal using a precharge voltage source. A signal corresponding to a charge stored in a memory cell 205 may be extracted through a first cascode, and a reference signal based on the dummy digit line may be transferred through a second cascode. The extracted signal and the reference signal may each charge a respective capacitor (e.g., an AMPCAP), and the sense component 250 may compare the extracted signal from the memory cell and the extracted signal from the source of the reference signal to determine a logic state (e.g., a logic 1 or a logic 0) stored in the memory cell 205. By comparing the reference signal developed at the dummy digit line to the extracted signal from the memory cell, the effect of variations in memory cell performance on a sense window at the sense component may be reduced. Additionally, based on biasing the gates of the cascodes, the difference between the signals compared at the sense component may be low compared to other sensing schemes. The biasing may thus reduce power consumption associated with the access operation.

Figure 3:
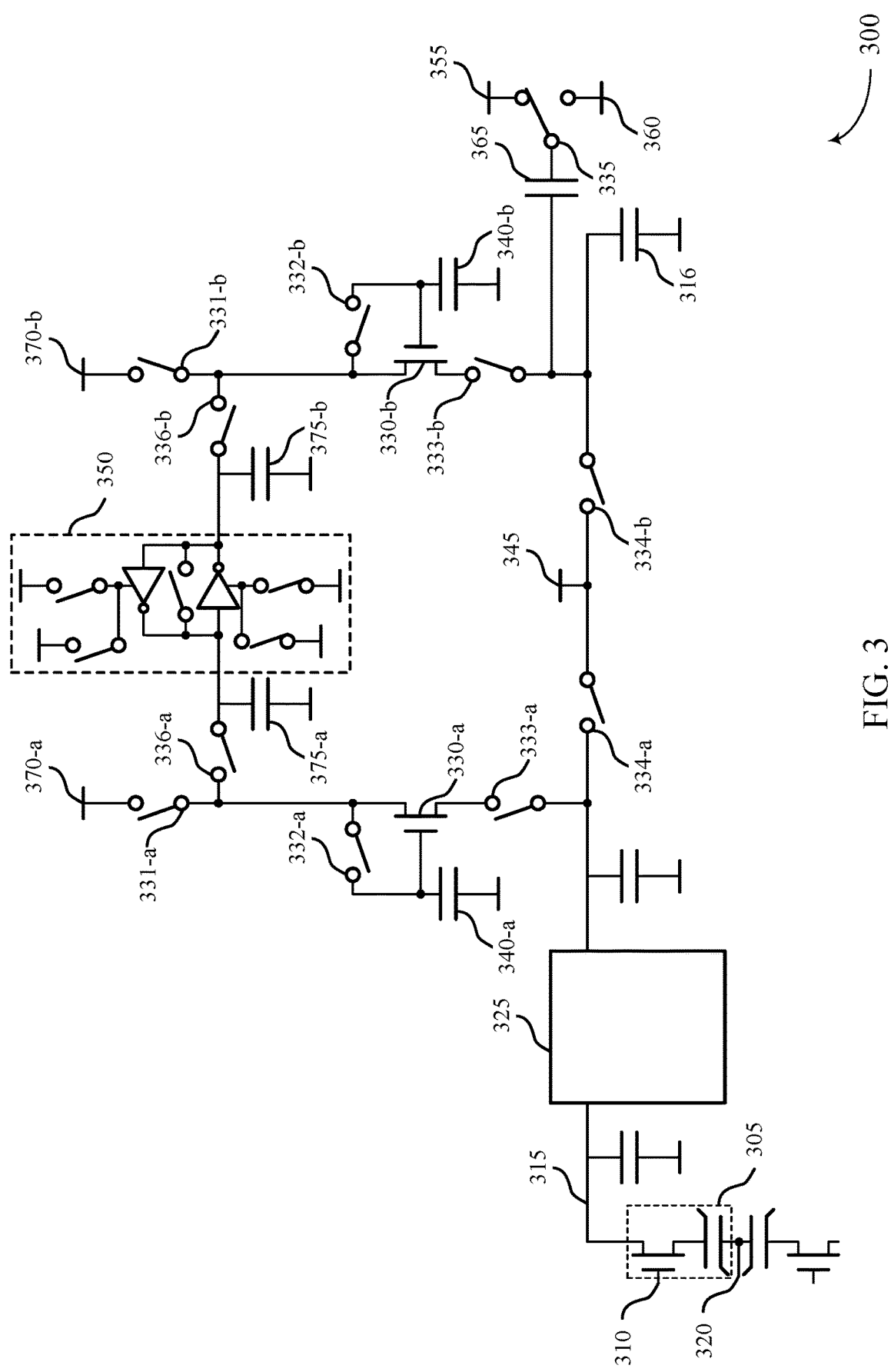
FIG. 3 illustrates an example of a circuit that supports low voltage ferroelectric memory cell sensing in accordance with examples as disclosed herein.

FIG. 3 illustrates an example of a circuit 300 that supports low voltage ferroelectric memory cell sensing in accordance with examples as disclosed herein. In some examples, the circuit 300 may implement aspects of the system 100 or the memory die 200. For instance, the circuit 300 may include a memory cell 305, a word line 310, a digit line 315, a plate line 320, and a sense component 350, which may be examples of corresponding components described with reference to FIGS. 1 and 2. The circuit 300 may also include a selection component 325, cascodes 330, switches 331 through 336, gate capacitors 340, a precharge voltage source 345, a reference voltage source 355, a ground voltage source 360, a reference capacitor 365, biasing voltage sources 370, AMPCAPs 375, and a dummy digit line 316.

In some memory systems, a static reference signal may be compared to signal extracted from a memory cell. Over time the signal extracted from the memory cell may vary, which may shrink the sense window for an access operation and may introduce errors into the data. Additionally or alternatively, the static nature of the reference signal and the dynamic nature of the signal extracted from the memory cell may introduce timing constraints into the access operation. For example, if the sense component is activated to early or too late, the sense window may be smaller than it could have been.

A memory device may be configured to develop a reference signal using similar techniques as those that are used to develop a signal from the memory cell 305. For example, the circuit 300 may include a capacitor 375-*b*, a cascode 330-*b*, a dummy digit line 316, and one or more switches (e.g., switches 331-*b*, 332-*b*, 333-*b*, 334-*b*, 335, and 336-*b*) configured to develop a signal based on a reference signal that may be static. By developing the signal associated with the reference signal using similar techniques as those used to develop the signal from the memory cell, the signal developed from the reference signal may track (in time) similar to the signal developed from the memory cell and may reduce timing constraints associated with the access operation. Additionally or alternatively, by developing the signal associated with the reference signal using similar techniques as those used to develop the signal from the memory cell, the signal developed from the reference signal may exhibit similar variations as the signal developed from the memory cell 305 as the memory device wears through use (e.g., as the memory device ages). In some examples, a dummy digit line 316 may be an example of a digit line in a memory device that is not being used to store data on behalf of a host device. In such cases, such digit lines may be used to develop signal from static reference signals.

A cascode (e.g., cascode 330-*a* or cascode 330-*b*) may be an example of a two-stage amplifier that comprises two transistors. For example, a common-emitter stage (e.g., a first transistor) may feed into a common-base stage (e.g., a second transistor). As compared to single stage amplifiers, cascodes may have a higher input-output isolation, a higher input impedance, a higher output impendence, a higher bandwidth, or a combination thereof.

Prior to an access operation (e.g., during an idle period of the circuit 300), the switches 336 may be activated (e.g., transistors associated with the switches 336 may be conductive), and the switch 335 may be activated to couple the reference voltage source 355 with the reference capacitor 365. In some examples, the reference voltage source 355 may provide a reference voltage VSAREF (e.g., 2.2 volts (V)), and the reference capacitor 365 may be referred to as a reference capacitor CREF (e.g., with a capacitance of 3.8 femtofarads (fF)).

Prior to an access operation, the switches 331 and 332 may be activated to couple the biasing voltage sources 370 with the gate capacitors 340 of the cascodes 330-*a* and 330-*b*. In some examples, each biasing voltage source 370 may provide a voltage of 2.8 V. In some examples, each gate capacitor 340 may be referred to as a voltage threshold capacitor VthCap associated with a respective cascode 330. Based on the biasing voltage source 370-*a* with the gate capacitor 340-*a*, a charge may be stored in the gate capacitor 340-*a* to bias the gate of the cascode 330-*a* to a voltage that compensates for a threshold voltage of the cascode 330-*a*. Based on a similar biasing operation, the gate of the cascode 330-*b* may be biased to a voltage that compensates for a threshold voltage of the cascode 330-*b*. The switches 333 and 334 may be deactivated (e.g., transistors associated with the switches 333 and 334 may be non-conductive) to isolate components of the circuit 300 during the biasing operation.

In some examples, an access operation may be initiated based on a command (e.g., from a memory controller or a host device). The switches 334 may be activated to couple the digit line 315 (e.g., through the selection component 325) and the dummy digit line 316 with the precharge voltage source 345. The precharge voltage source 345 may precharge the digit line 315 (e.g., by storing a charge in a parasitic capacitance of the digit line 315) and the dummy digit line 316 to a precharge voltage (e.g., 1.5 V). In some examples, the dummy digit line 316 may include a capacitor DL #cap, which may be referred to as a mimic capacitor.

After precharging the digit line 315 and the dummy digit line 316, the biasing voltage sources 370 may be isolated from other components of the circuit 300 by deactivating the switches 331. The switches 333 may be activated to initiate a sampling of the respective threshold voltages of each cascode 330. That is, the gate of the cascode 330-a may be coupled through the cascode 330-a and the switch 333-a with the digit line 315, and the gate of the cascode 330-b may be coupled through the cascode 330-b and the switch 333-b with the dummy digit line 316. Based on this coupling, the voltages on the gates of the respective cascodes 330 may be set a voltage level that compensates for the individual threshold voltages on each cascode 330. After the sampling, the switches 334 may be deactivated to isolate the digit line 315 and the dummy digit line 316 from the precharge voltage source 345.

After isolating the digit line 315 and the dummy digit line 316 from the precharge voltage source 345, charge sharing may be initiated to extract a charge stored in the memory cell 305. The switches 332 and 333 may be deactivated to isolate the digit line 315 and the dummy digit line 316 from the cascodes 330 and the gate capacitors 340. The switch 335 may be activated to couple the reference capacitor 365 with the ground voltage source 360. In some examples, the ground voltage source may be a virtual ground, or have a voltage of zero (0) V. The word line 310 may be activated to couple the digit line 315 with the memory cell 305. Charge sharing between the digit line 315 and the memory cell 305 may allow a signal associated with a logic state stored in the memory cell 305 to be transferred to the digit line 315. Additionally, the switches 331 may be activated during the charge sharing.

After the charge sharing, the signal associated with the logic state may be extracted to be sensed at the sense component 350. The switches 331 may be deactivated to isolate the components of the circuit 300 from the biasing voltage sources 370. The switches 333 may be activated to couple the digit line 315 with the cascode 330-a and the dummy digit line 316 with the cascode 330-b. The extracted signal may be transferred from the digit line 315 through the cascode 330-a and charge the AMPCAP 375-a. Similarly, the reference signal may be transferred from the dummy digit line 316 through the cascode 330-b and charge the AMPCAP 375-b.

After the signal is extracted, the switches 336 may be deactivated to isolate the AMPCAPs 375 and the sense component 350 from other components of the circuit 300. The sense component 350 may then compare the extracted signal to the reference signal (e.g., based on the charges stored in the AMPCAPs 375) to determine the logic state (e.g., a logic 1 or a logic 0) stored in the memory cell 305. By comparing the reference signal developed at the dummy digit line 316 to the extracted signal from the memory cell 305, the effect of variations in memory cell performance on a sense window at the sense component 350 may be reduced. Additionally, based on biasing the gates of the cascodes 330, the difference between the signals compared at the sense component 350 may be low compared to other sensing schemes. The biasing may thus reduce power consumption associated with the access operation.

Figure 4:
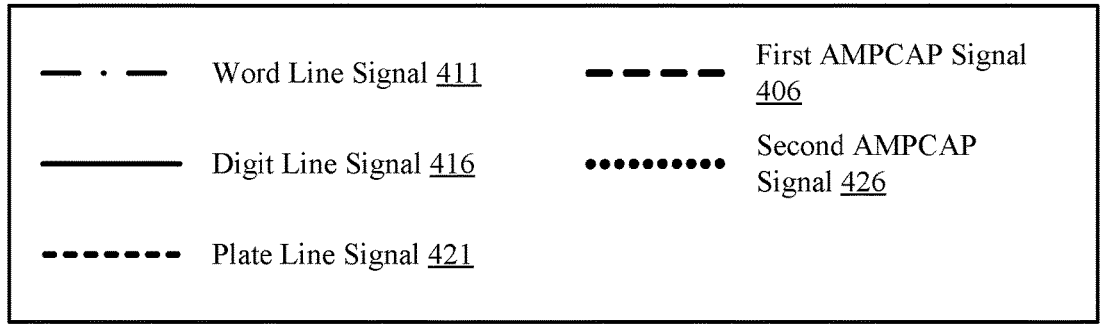
FIG. 4 illustrates an example of a timing diagram that supports low voltage ferroelectric memory cell sensing in accordance with examples as disclosed herein.
Figure 4:
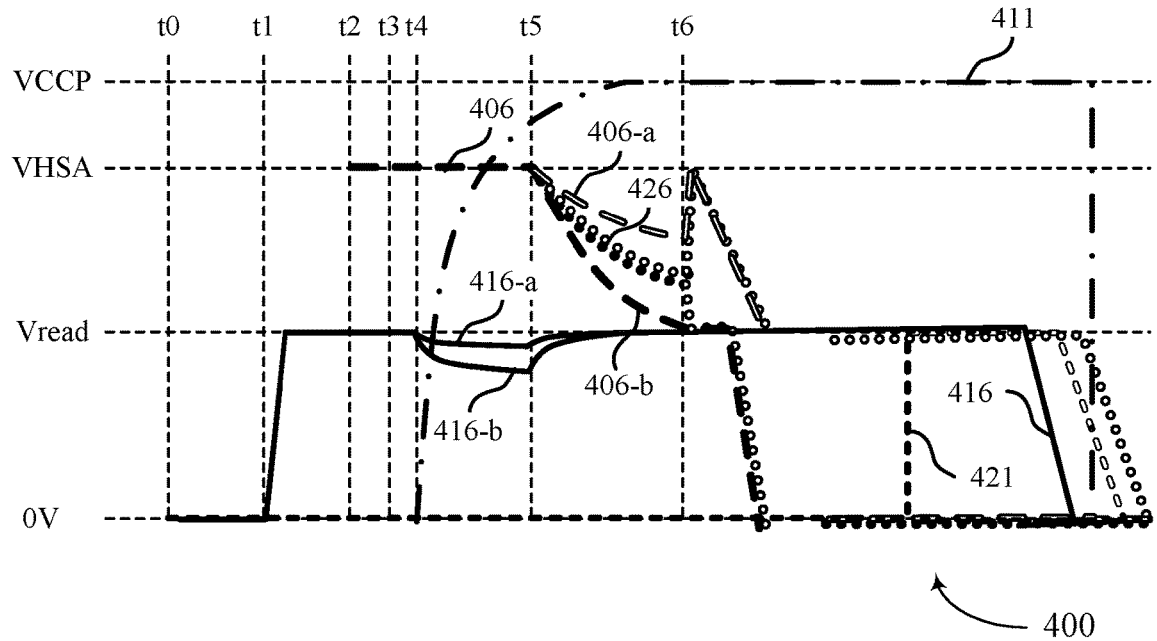

FIG. 4 illustrates an example of a timing diagram 400 that supports low voltage ferroelectric memory cell sensing in accordance with examples as disclosed herein. The timing diagram 400 may illustrate a sensing operation associated with a memory cell. The timing diagram 400 shows various voltage levels (e.g., voltage signals as a function of time) associated with components and nodes of the circuit 300 described with reference to FIG. 3 to illustrate performing a sensing operation. Additionally, a table 401 illustrates states of components at times t0 through t6 identified in the timing diagram 400. For example, the table 401 may illustrate the respective states of a word line 310 and switches 331 through 336, which may be examples of corresponding devices described with reference to FIG. 3. The time and voltage scales used in FIG. 4 are for illustration purposes and may not depict particular values in some cases.

The time t0 may correspond to an idle period, such as before an access operation or between access operations. The switches 336 may be activated (which may be represented as ON in the table 401), and the switch 335 may be activated to couple a reference voltage VSAREF (e.g., 2.2 V) with a reference capacitor. The switches 331 and 332 may be activated to bias a gate of each cascode to a respective bias voltage to compensate for a voltage threshold of the cascode. The switches 333 and 334 and the word line 310 may be deactivated (which may be represented as OFF in the table 401) to isolate components.

In some examples, an access operation may be initiated based on a command (e.g., from a memory controller or a host device). At the time t1, access lines may be precharged as part of the access operation and/or based on receiving a command. The switches 334 may be activated to couple a digit line 315 (e.g., through a selection component) and a dummy digit line 316 with a precharge voltage source 345. The precharge voltage source may precharge the digit line (e.g., by storing a charge in a parasitic capacitance of the digit line) and the dummy digit line to a precharge voltage (e.g., 1.5 V). Based on precharging the digit line, a digit line signal 416 may increase from 0 V (e.g., a ground voltage, a virtual ground, or a relative ground) to a voltage Vread. The digit line signal 416 may refer to a signal on the digit line 315 or the dummy digit line 316.

After the precharging, the respective threshold voltages of each cascode may be sampled beginning at the time t2. In some examples, the time t2 may occur 15 nanoseconds (ns) after the time t1. The switches 331 may be deactivated to isolate the biasing voltage sources 370 from the cascodes 330. The signals at a sense component (e.g., a first AMPCAP signal 406 and a second AMPCAP signal 426) may be each be at a voltage VHSA. The switches 333 may be activated so that a first gate of a first cascode 330-a may be coupled through the first cascode with the digit line 315, and a second gate of a second cascode 330-b may be coupled through the second cascode with the dummy digit line 316. The voltages of the digit line 315 and the dummy digit line 316 may be equalized with the voltages through the cascodes 330 based on the coupling. As the sampling ends at the time t3, the switches 334 may be deactivated to isolate the digit line 315 and the dummy digit line 316 from the precharge voltage source 345. In some examples, the time t3 may occur 5 ns after the time t2.

After isolating the digit line and the dummy digit line from the precharge voltage source, charge sharing may be initiated at the time t4 to extract a charge stored in a memory cell. In some examples, the time t4 may occur 1 ns or less after the time t3. The switches 332 and 333 may be deactivated to isolate the digit line 315 and the dummy digit line 316 from the cascodes 330. The switch 335 may be activated to couple the reference capacitor with a ground voltage source. In some examples, the ground voltage source may be a virtual ground, or have a voltage of zero (0) V. The word line 310 may be activated to couple the digit line with the memory cell 305. Activating the word line 310 may include applying a voltage to increase a word line signal 411 to a pumped common collector voltage VCCP. Charge sharing between the digit line 315 and the memory cell 305 may allow a signal associated with a logic state stored in the memory cell 305 to be transferred to the digit line 315. The charge sharing between the memory cell 305 and the digit line 315 is reflected in the decrease of the digit line signal 416 after the time t4. The diagram 400 illustrates two separate digit line signals after t4. One of the digit line signals (e.g., digit line signal 416-a) occurs if a logic '1' is stored on the memory cell 305. The other one of the digit line signals (e.g., digit line signal 416-b) occurs if a logic '0' is stored on the memory cell 305. Similar, splitting of signals is also illustrated for first AMPCAP signal 406. Additionally, the switches 331 may be activated during the charge sharing. A plate line voltage 421 may be kept low (e.g., at or near 0 V) during the charge sharing, which may reduce power consumption associated with the access operation.

After the charge sharing, at the time t5 the signal associated with the logic state may be extracted to be sensed at the sense component 350. In some examples, the time t5 may occur 15 ns after the time t4. The switches 331 may be deactivated to isolate the components from the biasing voltage sources 370. The switches 333 may be activated to couple the digit line 315 with the first cascode 330-a and the dummy digit line 316 with the second cascode 330-b. The extracted signal may be transferred between the digit line 315 through the first cascode 330-a and a first AMPCAP 375-a, which may result in a decrease in the first AMPCAP signal 406. The diagram 400 illustrates two separate first AMPCAP signals 406 after t5. One of the first AMPCAP signals (e.g., first AMPCAP signal 406-a) occurs if a logic '1' is stored on the memory cell 305. The other one of the first AMPCAP signals (e.g., first AMPCAP signal 406-b) occurs if a logic '0' is stored on the memory cell 305. Similarly, the reference signal may be transferred between the dummy digit line 316 through the second cascode 330-b and a second AMPCAP 375-b, which may result in a decrease in the second AMPCAP signal 426. Between time t5 and time t6, the development of the first AMPCAP signal 406 tracks with the development of the second AMPCAP signal 426. In such situations, the sense window for reading data in such circuits and operations may be more robust and less-susceptible to a timing of when the sense component 350 is activated or fired. Additionally or alternatively, by using a dummy digit line 316, cascode 330-b, and the AMPCAP 375-b, among other components, to develop the second AMPCAP signal 426 based on a static reference signal, the differences in the variations between the signal from the memory cell and the signal from the reference signal that may occur as a memory device ages may be reduced. In such situations, the memory device may have a circuit that creates a kind of differential operation, where changes (due to the age of the memory device) may affect both the signal from the memory cell and the signal from the reference signal in similar ways.

After the signal is extracted, at the time t6 the switches 336 may be deactivated to isolate the AMPCAPs 375 and the sense component 350 from other components (e.g., the cascodes, the digit line, etc.). The sense component 350 may then compare the first AMPCAP signal 406 (e.g., based on the extracted signal) to the second AMPCAP signal 426 (e.g., based on the reference signal) to determine the logic state (e.g., a logic 1 or a logic 0) stored in the memory cell 305. For example, if the first AMPCAP signal 406 is less than the second AMPCAP signal 426, the sense component may determine that the memory cell stored a first logic state (e.g., a logic 0 or a logic 1). On the other hand, if the first AMPCAP signal 406 is greater than the second AMPCAP signal 426, the sense component may determine that the memory cell stored a second logic state (e.g., a logic 1 or a logic 0) different from the first logic state.

By comparing signals based on the reference signal developed at the dummy digit line 316 and the extracted signal from the memory cell 305, the effect of variations in memory cell 305 performance on a sense window at the sense component 350 may be reduced. Additionally, based on biasing the gates of the cascodes, the difference between the first AMPCAP signal 406 and the second AMPCAP signal 426 may be lower as compared to signals at a sense component in other sensing schemes. The biasing may thus reduce power consumption associated with the access operation.

Figure 5:
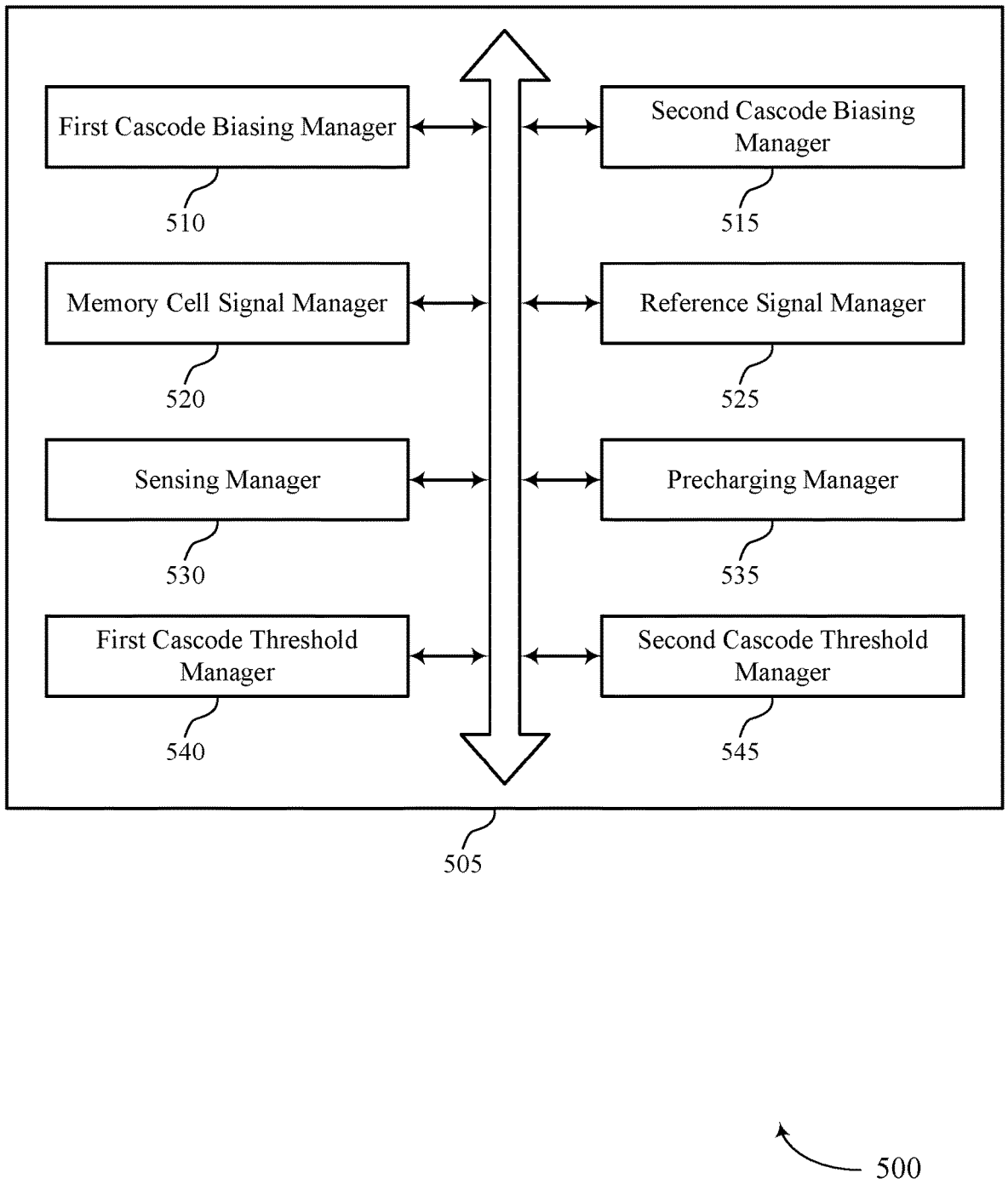
FIG. 5 shows a block diagram of a memory array that supports low voltage ferroelectric memory cell sensing in accordance with examples as disclosed herein.

FIG. 5 shows a block diagram 500 of a memory array 505 that supports low voltage ferroelectric memory cell sensing in accordance with examples as disclosed herein. The memory array 505 may be an example of aspects of a memory array as described with reference to FIGS. 1 through 4. The memory array 505 may include a first cascode biasing manager 510, a second cascode biasing manager 515, a memory cell signal manager 520, a reference signal manager 525, a sensing manager 530, a precharging manager 535, a first cascode threshold manager 540, and a second cascode threshold manager 545. Each of these modules may communicate, directly or indirectly, with one another (e.g., via one or more buses).

The first cascode biasing manager 510 may bias, as part of an access operation of a ferroelectric memory cell, a first gate of a first cascode to a first voltage to compensate for a first threshold voltage of the first cascode, the first cascode coupled with a digit line associated with the ferroelectric memory cell.

The second cascode biasing manager 515 may bias a second gate of a second cascode to a second voltage to compensate for a second threshold voltage of the second cascode, the second cascode coupled with a voltage source for providing a reference signal during the access operation.

The memory cell signal manager 520 may transfer, through the first cascode, a third voltage associated with the ferroelectric memory cell to a first capacitor based on biasing the first gate of the first cascode to the first voltage. In some examples, the memory cell signal manager 520 may select a word line to cause the ferroelectric memory cell to become coupled with the digit line. In some examples, the memory cell signal manager 520 may initiate, based on selecting the word line, charge sharing between the ferroelectric memory cell and the first capacitor, where transferring the third voltage to the first capacitor is based on the charge sharing.

In some examples, the memory cell signal manager 520 may isolate, using a transistor, the second cascode from the voltage source based on selecting the word line. In some examples, the memory cell signal manager 520 may isolate, using a transistor, the first cascode from the digit line before selecting the word line. In some examples, the memory cell signal manager 520 may couple, using the transistor, the first cascode with the digit line after selecting the word line and based on initiating the charge sharing.

The reference signal manager 525 may transfer, through the second cascode, a fourth voltage associated with the reference signal to a second capacitor based on biasing the second gate of the second cascode to the second voltage.

The sensing manager 530 may determine a logic state stored by the ferroelectric memory cell based on the third voltage transferred to the first capacitor and the fourth voltage transferred to the second capacitor. In some examples, the sensing manager 530 may isolate, using a first transistor, the first capacitor from the first cascode. In some examples, the sensing manager 530 may isolate, using a second transistor, the second capacitor from the second cascode. In some examples, the sensing manager 530 may activate, after isolating the first capacitor and the second capacitor, a sense component configured to sense the logic state stored by the ferroelectric memory cell. In some examples, the sensing manager 530 may compare, using the sense component, the third voltage transferred to the first capacitor and the fourth voltage transferred to the second capacitor. In some cases, the sense component may include a latch.

The precharging manager 535 may precharge, as part of the access operation, the digit line and a dummy digit line associated with the reference signal to a precharge voltage, where biasing the first gate of the first cascode and biasing the second gate of the second cascode are based on precharging the digit line and the dummy digit line. In some examples, the precharging manager 535 may activate a set of transistors to couple a precharge voltage source with the digit line and the dummy digit line. In some examples, the precharging manager 535 may isolate, using a transistor, the first gate of the first cascode from the digit line during at least a portion of the precharge operation. In some examples, the precharging manager 535 may couple, using one or more transistors, the first gate of the first cascode to a second voltage source to bias the first gate based on isolating the first gate from the digit line using the transistor. In some cases, the dummy digit line may include a mimic capacitor.

The first cascode threshold manager 540 may store a first charge associated with the first voltage threshold in a first gate capacitor coupled with the first gate of the first cascode, where compensating for the first voltage threshold is based on storing the first charge.

The second cascode threshold manager 545 may store a second charge associated with the second voltage threshold in a second gate capacitor coupled with the second gate of the second cascode, where compensating for the second voltage threshold is based on storing the second charge.

Figure 6:
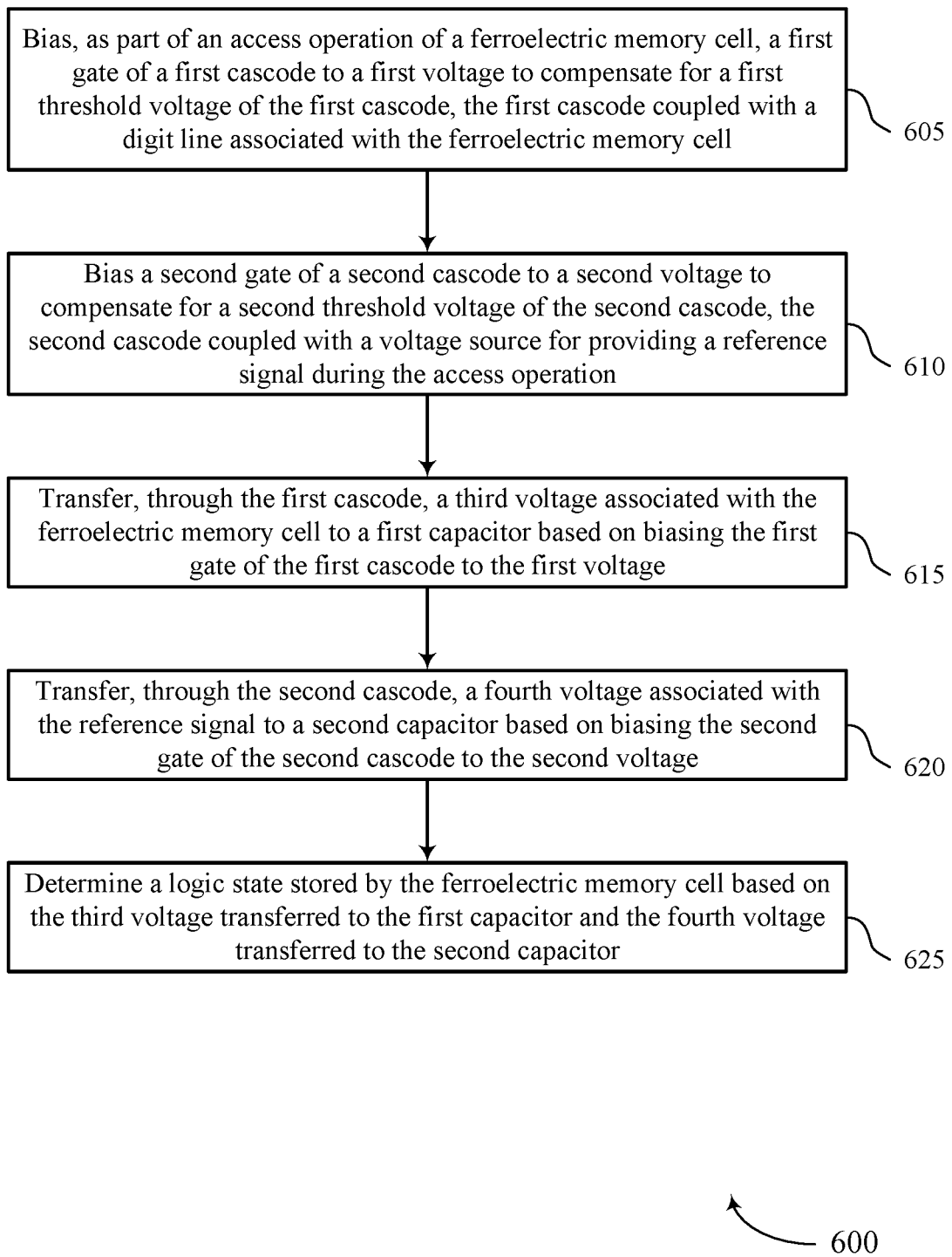
FIGS. 6 through 8 show flowcharts illustrating a method or methods that support low voltage ferroelectric memory cell sensing in accordance with examples as disclosed herein.

FIG. 6 shows a flowchart illustrating a method or methods 600 that supports low voltage ferroelectric memory cell sensing in accordance with examples as disclosed herein. The operations of method 600 may be implemented by a memory array or its components as described herein. For example, the operations of method 600 may be performed by a memory array as described with reference to FIG. 5. In some examples, a memory array may execute a set of instructions to control the functional elements of the memory array to perform the described functions. Additionally or alternatively, a memory array may perform aspects of the described functions using special-purpose hardware.

At 605, the memory array may bias, as part of an access operation of a ferroelectric memory cell, a first gate of a first cascode to a first voltage to compensate for a first threshold voltage of the first cascode, the first cascode coupled with a digit line associated with the ferroelectric memory cell. The operations of 605 may be performed according to the methods described herein. In some examples, aspects of the operations of 605 may be performed by a first cascode biasing manager as described with reference to FIG. 5.

At 610, the memory array may bias a second gate of a second cascode to a second voltage to compensate for a second threshold voltage of the second cascode, the second cascode coupled with a voltage source for providing a reference signal during the access operation. The operations of 610 may be performed according to the methods described herein. In some examples, aspects of the operations of 610 may be performed by a second cascode biasing manager as described with reference to FIG. 5.

At 615, the memory array may transfer, through the first cascode, a third voltage associated with the ferroelectric memory cell to a first capacitor based on biasing the first gate of the first cascode to the first voltage. The operations of 615 may be performed according to the methods described herein. In some examples, aspects of the operations of 615 may be performed by a memory cell signal manager as described with reference to FIG. 5.

At 620, the memory array may transfer, through the second cascode, a fourth voltage associated with the reference signal to a second capacitor based on biasing the second gate of the second cascode to the second voltage. The operations of 620 may be performed according to the methods described herein. In some examples, aspects of the operations of 620 may be performed by a reference signal manager as described with reference to FIG. 5.

At 625, the memory array may determine a logic state stored by the ferroelectric memory cell based on the third voltage transferred to the first capacitor and the fourth voltage transferred to the second capacitor. The operations of 625 may be performed according to the methods described herein. In some examples, aspects of the operations of 625 may be performed by a sensing manager as described with reference to FIG. 5.

In some examples, an apparatus as described herein may perform a method or methods, such as the method 600. The apparatus may include features (e.g., a controller, a processor, etc., operable to cause the apparatus to perform the method or methods), means, or instructions (e.g., a non-transitory computer-readable medium storing instructions executable by a processor) for biasing, as part of an access operation of a ferroelectric memory cell, a first gate of a first cascode to a first voltage to compensate for a first threshold voltage of the first cascode, the first cascode coupled with a digit line associated with the ferroelectric memory cell, biasing a second gate of a second cascode to a second voltage to compensate for a second threshold voltage of the second cascode, the second cascode coupled with a voltage source for providing a reference signal during the access operation, transferring, through the first cascode, a third voltage associated with the ferroelectric memory cell to a first capacitor based on biasing the first gate of the first cascode to the first voltage, transferring, through the second cascode, a fourth voltage associated with the reference signal to a second capacitor based on biasing the second gate of the second cascode to the second voltage, and determining a logic state stored by the ferroelectric memory cell based on the third voltage transferred to the first capacitor and the fourth voltage transferred to the second capacitor.

Some examples of the method 600 and the apparatus described herein may further include operations, features, means, or instructions for precharging, as part of the access operation, the digit line and a dummy digit line associated with the reference signal to a precharge voltage, where biasing the first gate of the first cascode and biasing the second gate of the second cascode may be based on precharging the digit line and the dummy digit line. In some examples of the method 600 and the apparatus described herein, precharging the digit line and the dummy digit line further may include operations, features, means, or instructions for activating a set of transistors to couple a precharge voltage source with the digit line and the dummy digit line.

Some examples of the method 600 and the apparatus described herein may further include operations, features, means, or instructions for isolating, using a transistor, the first gate of the first cascode from the digit line during at least a portion of a precharge operation, and coupling, using one or more transistors, the first gate of the first cascode to a second voltage source to bias the first gate based on isolating the first gate from the digit line using the transistor. In some examples of the method 600 and the apparatus described herein, the dummy digit line includes a third capacitor.

Some examples of the method 600 and the apparatus described herein may further include operations, features, means, or instructions for isolating, using a first transistor, the first capacitor from the first cascode, isolating, using a second transistor, the second capacitor from the second cascode, and activating, after isolating the first capacitor and the second capacitor, a sense component configured to sense the logic state stored by the ferroelectric memory cell, where determining the logic state may be based on activating the sense component. Some examples of the method 600 and the apparatus described herein may further include operations, features, means, or instructions for comparing, using the sense component, the third voltage transferred to the first capacitor and the fourth voltage transferred to the second capacitor, where determining the logic state may be based on comparing the third voltage and the fourth voltage. In some examples of the method 600 and the apparatus described herein, the sense component includes a latch.

Some examples of the method 600 and the apparatus described herein may further include operations, features, means, or instructions for storing a first charge associated with the first threshold voltage in a first gate capacitor coupled with the first gate of the first cascode based on biasing the first gate to the first voltage, where compensating for the first threshold voltage may be based on storing the first charge, and storing a second charge associated with the second threshold voltage in a second gate capacitor coupled with the second gate of the second cascode based on biasing the second gate to the second voltage, where compensating for the second threshold voltage may be based on storing the second charge. Some examples of the method 600 and the apparatus described herein may further include operations, features, means, or instructions for biasing a word line to couple the ferroelectric memory cell with the digit line, and initiating, based on biasing the word line, charge sharing between the ferroelectric memory cell and the first capacitor, where transferring the third voltage to the first capacitor may be based on initiating the charge sharing.

Some examples of the method 600 and the apparatus described herein may further include operations, features, means, or instructions for isolating, using a transistor, the second cascode from the voltage source based on biasing the word line, where initiating the charge sharing may be based on isolating the transistor. Some examples of the method 600 and the apparatus described herein may further include operations, features, means, or instructions for isolating, using a transistor, the first cascode from the digit line before biasing the word line, and coupling, using the transistor, the first cascode with the digit line after biasing the word line and based on initiating the charge sharing.

Figure 7:
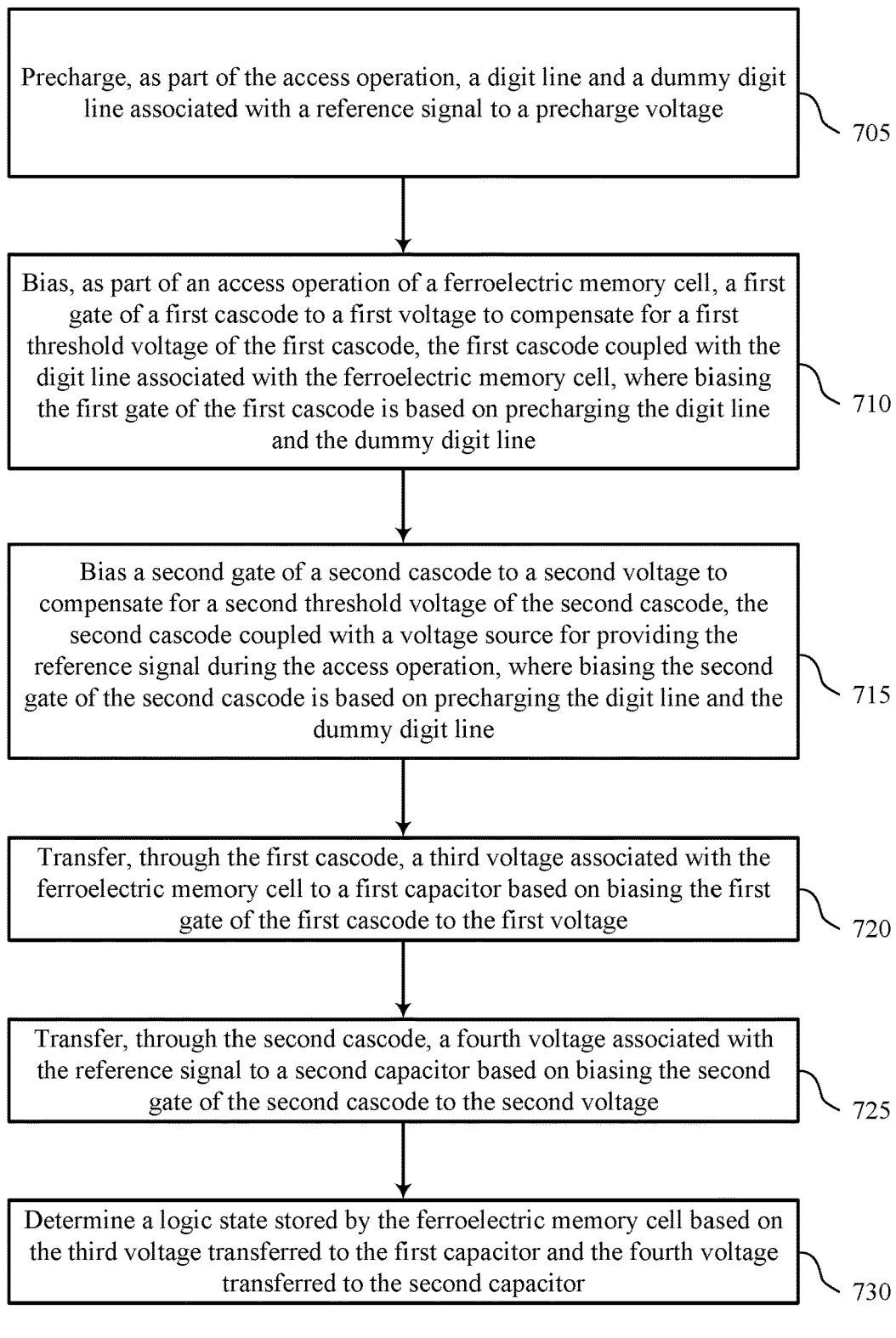

FIG. 7 shows a flowchart illustrating a method or methods 700 that supports low voltage ferroelectric memory cell sensing in accordance with examples as disclosed herein. The operations of method 700 may be implemented by a memory array or its components as described herein. For example, the operations of method 700 may be performed by a memory array as described with reference to FIG. 5. In some examples, a memory array may execute a set of instructions to control the functional elements of the memory array to perform the described functions. Additionally or alternatively, a memory array may perform aspects of the described functions using special-purpose hardware.

At 705, the memory array may precharge, as part of the access operation, the digit line and a dummy digit line associated with the reference signal to a precharge voltage. The operations of 705 may be performed according to the methods described herein. In some examples, aspects of the operations of 705 may be performed by a precharging manager as described with reference to FIG. 5.

At 710, the memory array may bias, as part of an access operation of a ferroelectric memory cell, a first gate of a first cascode to a first voltage to compensate for a first threshold voltage of the first cascode, the first cascode coupled with the digit line associated with the ferroelectric memory cell, where biasing the first gate of the first cascode is based on precharging the digit line and the dummy digit line. The operations of 710 may be performed according to the methods described herein. In some examples, aspects of the operations of 710 may be performed by a first cascode biasing manager as described with reference to FIG. 5.

At 715, the memory array may bias a second gate of a second cascode to a second voltage to compensate for a second threshold voltage of the second cascode, the second cascode coupled with a voltage source for providing the reference signal during the access operation, where biasing the second gate of the second cascode is based on precharging the digit line and the dummy digit line. The operations of 715 may be performed according to the methods described herein. In some examples, aspects of the operations of 715 may be performed by a second cascode biasing manager as described with reference to FIG. 5.

At 720, the memory array may transfer, through the first cascode, a third voltage associated with the ferroelectric memory cell to a first capacitor based on biasing the first gate of the first cascode to the first voltage. The operations of 720 may be performed according to the methods described herein. In some examples, aspects of the operations of 720 may be performed by a memory cell signal manager as described with reference to FIG. 5.

At 725, the memory array may transfer, through the second cascode, a fourth voltage associated with the reference signal to a second capacitor based on biasing the second gate of the second cascode to the second voltage. The operations of 725 may be performed according to the methods described herein. In some examples, aspects of the operations of 725 may be performed by a reference signal manager as described with reference to FIG. 5.

At 730, the memory array may determine a logic state stored by the ferroelectric memory cell based on the third voltage transferred to the first capacitor and the fourth voltage transferred to the second capacitor. The operations of 730 may be performed according to the methods described herein. In some examples, aspects of the operations of 730 may be performed by a sensing manager as described with reference to FIG. 5.

Figure 8:
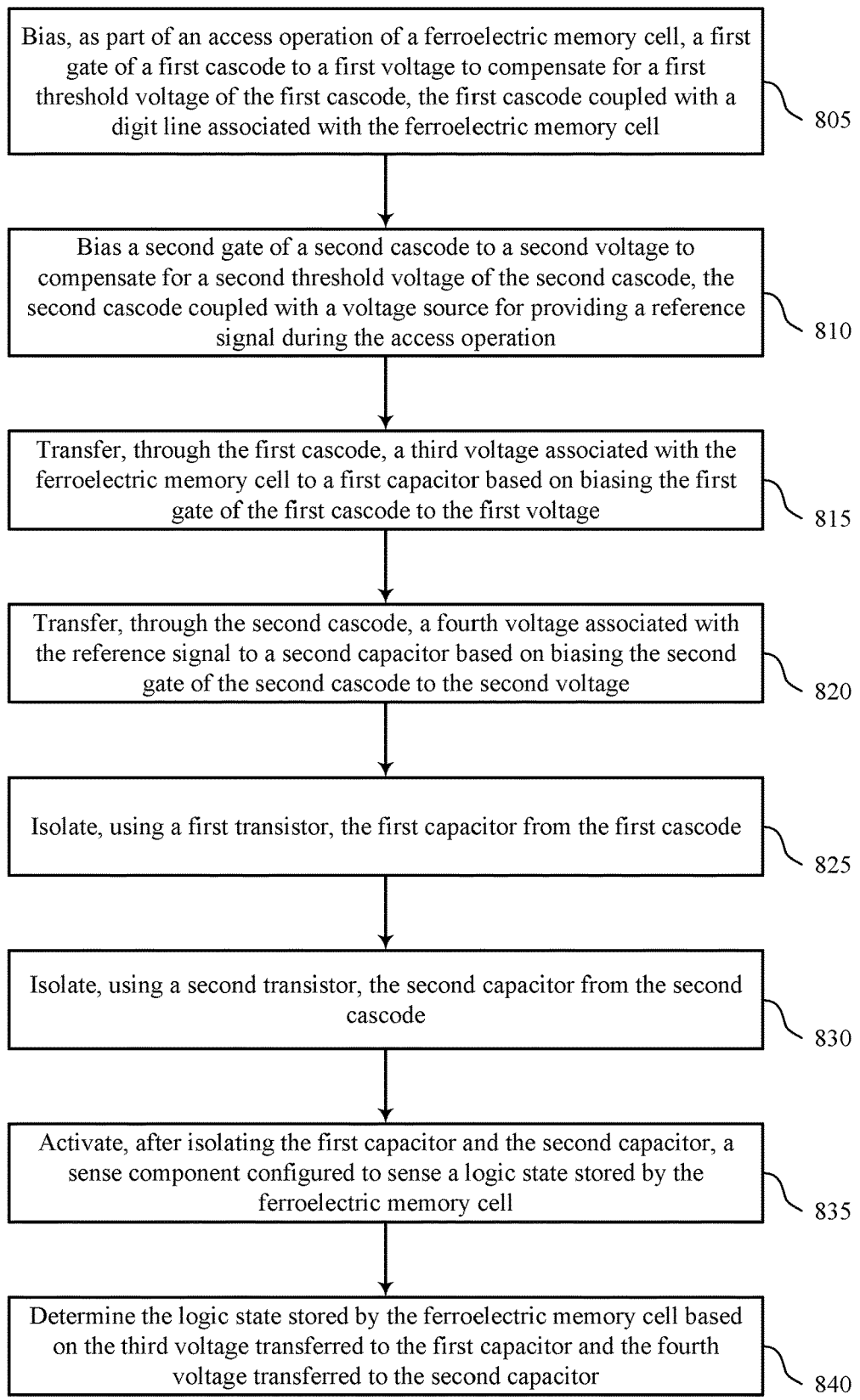

FIG. 8 shows a flowchart illustrating a method or methods 800 that supports low voltage ferroelectric memory cell sensing in accordance with examples as disclosed herein. The operations of method 800 may be implemented by a memory array or its components as described herein. For example, the operations of method 800 may be performed by a memory array as described with reference to FIG. 5. In some examples, a memory array may execute a set of instructions to control the functional elements of the memory array to perform the described functions. Additionally or alternatively, a memory array may perform aspects of the described functions using special-purpose hardware.

At 805, the memory array may bias, as part of an access operation of a ferroelectric memory cell, a first gate of a first cascode to a first voltage to compensate for a first threshold voltage of the first cascode, the first cascode coupled with a digit line associated with the ferroelectric memory cell. The operations of 805 may be performed according to the methods described herein. In some examples, aspects of the operations of 805 may be performed by a first cascode biasing manager as described with reference to FIG. 5.

At 810, the memory array may bias a second gate of a second cascode to a second voltage to compensate for a second threshold voltage of the second cascode, the second cascode coupled with a voltage source for providing a reference signal during the access operation. The operations of 810 may be performed according to the methods described herein. In some examples, aspects of the operations of 810 may be performed by a second cascode biasing manager as described with reference to FIG. 5.

At 815, the memory array may transfer, through the first cascode, a third voltage associated with the ferroelectric memory cell to a first capacitor based on biasing the first gate of the first cascode to the first voltage. The operations of 815 may be performed according to the methods described herein. In some examples, aspects of the operations of 815 may be performed by a memory cell signal manager as described with reference to FIG. 5.

At 820, the memory array may transfer, through the second cascode, a fourth voltage associated with the reference signal to a second capacitor based on biasing the second gate of the second cascode to the second voltage. The operations of 820 may be performed according to the methods described herein. In some examples, aspects of the operations of 820 may be performed by a reference signal manager as described with reference to FIG. 5.

At 825, the memory array may isolate, using a first transistor, the first capacitor from the first cascode. The operations of 825 may be performed according to the methods described herein. In some examples, aspects of the operations of 825 may be performed by a sensing manager as described with reference to FIG. 5.

At 830, the memory array may isolate, using a second transistor, the second capacitor from the second cascode. The operations of 830 may be performed according to the methods described herein. In some examples, aspects of the operations of 830 may be performed by a sensing manager as described with reference to FIG. 5.

At 835, the memory array may activate, after isolating the first capacitor and the second capacitor, a sense component configured to sense the logic state stored by the ferroelectric memory cell. The operations of 835 may be performed according to the methods described herein. In some examples, aspects of the operations of 835 may be performed by a sensing manager as described with reference to FIG. 5.

At 840, the memory array may determine the logic state stored by the ferroelectric memory cell based on the third voltage transferred to the first capacitor and the fourth voltage transferred to the second capacitor. The operations of 840 may be performed according to the methods described herein. In some examples, aspects of the operations of 840 may be performed by a sensing manager as described with reference to FIG. 5.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a ferroelectric memory cell, a first cascode selectively couplable with the ferroelectric memory cell, a first capacitor coupled with the first cascode and operable to receive a first voltage from the ferroelectric memory cell through the first cascode, a voltage source operable to provide a reference signal, a second cascode selectively couplable with the voltage source, a second capacitor coupled with the second cascode and operable to receive a second voltage from the voltage source through the second cascode, and a sense component coupled with the first capacitor and the second capacitor and operable to determine a logic state stored by the ferroelectric memory cell based on the first voltage received by the first capacitor and the second voltage received by the second capacitor.

Some examples of the apparatus may include a digit line selectively couplable with the ferroelectric memory cell and the first cascode. Some examples of the apparatus may include a precharge voltage source operable to precharge the digit line and a dummy digit line associated with the reference signal to a precharge voltage, and a set of transistors operable to couple the precharge voltage source with the digit line and the dummy digit line.

Some examples of the apparatus may include a transistor operable to isolate a first gate of the first cascode from the digit line during at least a portion of a precharge operation, and one or more transistors operable to couple the first gate of the first cascode to a second voltage source to bias the first gate based on isolating the first gate from the digit line using the transistor. In some examples, the dummy digit line includes a third capacitor.

Some examples of the apparatus may include a first transistor operable to isolate the first capacitor from the first cascode, and a second transistor operable to isolate the second capacitor from the second cascode, where the sense component may be operable to sense the logic state stored by the ferroelectric memory cell after isolating the first capacitor and the second capacitor. Some examples of the apparatus may include a transistor operable to isolate the second cascode from the voltage source.

In some examples, a first threshold voltage of the first cascode may be compensated before the first voltage may be transferred through the first cascode, and a second threshold voltage of the second cascode may be compensated before the second voltage may be transferred through the second cascode. Some examples of the apparatus may include a first gate capacitor coupled with a first gate of the first cascode and operable to store a third voltage associated with the first threshold voltage, where compensating for the first threshold voltage may be based on storing the third voltage, and a second gate capacitor coupled with a second gate of the second cascode and operable to store a fourth voltage associated with the second threshold voltage, where compensating for the second threshold voltage may be based on storing the fourth voltage.

An apparatus is described. The apparatus may include an array of ferroelectric memory cells, a controller coupled with the array of ferroelectric memory cells and operable to cause the apparatus to, bias a second gate of a second cascode to a second voltage to compensate for a second threshold voltage of the second cascode, the second cascode coupled with a voltage source for providing a reference signal during the access operation, transfer, through the first cascode, a third voltage associated with the ferroelectric memory cell to a first capacitor based on biasing the first gate of the first cascode to the first voltage, transfer, through the second cascode, a fourth voltage associated with the reference signal to a second capacitor based on biasing the second gate of the second cascode to the second voltage, and determine a logic state stored by the ferroelectric memory cell based on the third voltage transferred to the first capacitor and the fourth voltage transferred to the second capacitor.

Some examples may further include precharge, as part of the access operation, the digit line and a dummy digit line associated with the reference signal to a precharge voltage, where biasing the first gate of the first cascode and biasing the second gate of the second cascode may be based on precharging the digit line and the dummy digit line. Some examples may further include activating a set of transistors to couple a precharge voltage source with the digit line and the dummy digit line.

Some examples may further include isolating, using a first transistor, the first capacitor from the first cascode, isolate, using a second transistor, the second capacitor from the second cascode, and activate, after isolating the first capacitor and the second capacitor, a sense component configured to sense the logic state stored by the ferroelectric memory cell, where determining the logic state may be based on activating the sense component.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   precharging, as part of an access operation of a ferroelectric memory cell, a digit line to a precharge voltage and a dummy digit line associated with a reference signal to the precharge voltage;
   transferring, through a first cascode, a first voltage associated with the ferroelectric memory cell to a first capacitor based at least in part on precharging the digit line and the dummy digit line;
   transferring, through a second cascode, a second voltage associated with the reference signal to a second capacitor based at least in part on precharging the digit line and the dummy digit line, wherein the second cascode is coupled with a voltage source for providing the reference signal during the access operation; and
   determining a logic state stored by the ferroelectric memory cell based at least in part on the first voltage transferred to the first capacitor and the second voltage transferred to the second capacitor, wherein the second voltage transferred to the second capacitor is different than a voltage associated with the voltage source.

2. The method of claim 1, further comprising:
   biasing, as part of the access operation, a first gate of the first cascode to a third voltage to compensate for a first threshold voltage of the first cascode, the first cascode coupled with the digit line associated with the ferroelectric memory cell; and
   biasing a second gate of the second cascode to a fourth voltage to compensate for a second threshold voltage of the second cascode, wherein biasing the first gate of the first cascode and biasing the second gate of the second cascode are based at least in part on precharging the digit line and the dummy digit line.

3. The method of claim 2, further comprising:
   isolating, using a transistor, the first gate of the first cascode from the digit line during at least a portion of a precharge operation; and
   coupling, using one or more transistors, the first gate of the first cascode to a second voltage source to bias the first gate based at least in part on isolating the first gate from the digit line using the transistor.

4. The method of claim 2, further comprising:
   storing a first charge associated with the first threshold voltage in a first gate capacitor coupled with the first gate of the first cascode based at least in part on biasing the first gate to the third voltage, wherein compensating for the first threshold voltage is based at least in part on storing the first charge; and
   storing a second charge associated with the second threshold voltage in a second gate capacitor coupled with the second gate of the second cascode based at least in part on biasing the second gate to the fourth voltage, wherein compensating for the second threshold voltage is based at least in part on storing the second charge.

5. The method of claim 2, further comprising:
   biasing a word line to couple the ferroelectric memory cell with the digit line; and
   initiating, based at least in part on biasing the word line, charge sharing between the ferroelectric memory cell and the first capacitor, wherein transferring the first voltage to the first capacitor is based at least in part on initiating the charge sharing.

6. The method of claim 5, further comprising:
isolating, using a transistor, the second cascode from the voltage source based at least in part on biasing the word line, wherein initiating the charge sharing is based at least in part on isolating the transistor.

7. The method of claim 5, further comprising:
isolating, using a transistor, the first cascode from the digit line before biasing the word line; and
coupling, using the transistor, the first cascode with the digit line after biasing the word line and based at least in part on initiating the charge sharing.

8. The method of claim 1, wherein precharging the digit line and the dummy digit line further comprises:
activating a set of transistors to couple a precharge voltage source with the digit line and the dummy digit line.

9. The method of claim 1, wherein the dummy digit line comprises a third capacitor.

10. The method of claim 1, further comprising:
isolating, using a first transistor, the first capacitor from the first cascode;
isolating, using a second transistor, the second capacitor from the second cascode; and
activating, after isolating the first capacitor and the second capacitor, a sense component configured to sense the logic state stored by the ferroelectric memory cell, wherein determining the logic state is based at least in part on activating the sense component.

11. The method of claim 10, further comprising:
comparing, using the sense component, the first voltage transferred to the first capacitor and the second voltage transferred to the second capacitor, wherein determining the logic state is based at least in part on comparing the first voltage and the second voltage.

12. The method of claim 10, wherein the sense component comprises a latch.

13. An apparatus, comprising:
a ferroelectric memory cell;
a digit line selectively couplable with the ferroelectric memory cell;
a precharge voltage source operable to precharge the digit line to a precharge voltage and a dummy digit line to the precharge voltage;
a set of transistors operable to couple the precharge voltage source with the digit line and the dummy digit line;
a voltage source operable to provide a reference signal to the dummy digit line; and
a sense component operable to determine a logic state stored by the ferroelectric memory cell based at least in part on a first voltage received from the ferroelectric memory cell and a second voltage received from the dummy digit line, wherein the second voltage is different than a voltage associated with the voltage source.

14. The apparatus of claim 13, further comprising:
a first cascode selectively couplable with the digit line and the ferroelectric memory cell;
a first capacitor coupled with the first cascode and operable to receive the first voltage from the ferroelectric memory cell through the first cascode;
a second cascode selectively couplable with the voltage source and the dummy digit line; and
a second capacitor coupled with the second cascode and operable to receive the second voltage from the dummy digit line through the second cascode.

15. The apparatus of claim 14, further comprising:
a transistor operable to isolate a first gate of the first cascode from the digit line during at least a portion of a precharge operation; and
one or more transistors operable to couple the first gate of the first cascode to a second voltage source to bias the first gate based at least in part on isolating the first gate from the digit line using the transistor.

16. The apparatus of claim 14, further comprising:
a first transistor operable to isolate the first capacitor from the first cascode; and
a second transistor operable to isolate the second capacitor from the second cascode, wherein the sense component is operable to sense the logic state stored by the ferroelectric memory cell after isolating the first capacitor and the second capacitor.

17. The apparatus of claim 14, wherein:
a first threshold voltage of the first cascode is compensated before the first voltage is transferred through the first cascode; and
a second threshold voltage of the second cascode is compensated before the second voltage is transferred through the second cascode.

18. The apparatus of claim 13, wherein the dummy digit line comprises a capacitor.

19. An apparatus, comprising:
an array of ferroelectric memory cells; and
a controller coupled with the array of ferroelectric memory cells and operable to cause the apparatus to:
precharge, as part of an access operation of a ferroelectric memory cell, a digit line to a precharge voltage and a dummy digit line associated with a reference signal to the precharge voltage;
transfer, through a first cascode, a first voltage associated with the ferroelectric memory cell to a first capacitor based at least in part on precharging the digit line and the dummy digit line;
transfer, through a second cascode, a second voltage associated with the reference signal to a second capacitor based at least in part on precharging the digit line and the dummy digit line, wherein the second cascode is coupled with a voltage source for providing the reference signal during the access operation; and
determine a logic state stored by the ferroelectric memory cell based at least in part on the first voltage transferred to the first capacitor and the second voltage transferred to the second capacitor, wherein the second voltage transferred to the second capacitor is different than a voltage associated with the voltage source.

20. The apparatus of claim 19, wherein the controller is further operable to cause the apparatus to:
bias, as part of the access operation, a first gate of the first cascode to a third voltage to compensate for a first threshold voltage of the first cascode, the first cascode coupled with the digit line associated with the ferroelectric memory cell; and
bias a second gate of the second cascode to a fourth voltage to compensate for a second threshold voltage of the second cascode, wherein biasing the first gate of the first cascode and biasing the second gate of the second cascode are based at least in part on precharging the digit line and the dummy digit line.

* * * * *